United States Patent
Duggal et al.

(10) Patent No.: US 6,855,027 B2
(45) Date of Patent: Feb. 15, 2005

(54) ENVIRONMENTALLY-STABLE ORGANIC ELECTROLUMINESCENT FIBERS

(75) Inventors: Anil Raj Duggal, Niskayuna, NY (US); Daniel Robert Olson, Voorheesville, NY (US)

(73) Assignee: General Electric Company, Niskayuna, NY (US)

(*) Notice: Subject to any disclaimer, the term of this patent is extended or adjusted under 35 U.S.C. 154(b) by 0 days.

(21) Appl. No.: 10/846,878

(22) Filed: May 17, 2004

(65) Prior Publication Data

US 2004/0212301 A1 Oct. 28, 2004

Related U.S. Application Data

(62) Division of application No. 09/683,139, filed on Nov. 27, 2001, now Pat. No. 6,753,096.

(51) Int. Cl.[7] .............................. H01J 9/00; H01J 9/24
(52) U.S. Cl. .......................... 445/24; 445/66; 313/504
(58) Field of Search ................................ 313/504, 505, 313/506, 509, 511, 512; 445/24, 25, 66, 67

(56) References Cited

U.S. PATENT DOCUMENTS

| | | | |
|---|---|---|---|
| 3,932,693 A | 1/1976 | Shaw et al. .................. 428/518 |
| 4,769,292 A | 9/1988 | Tang et al. .................. 428/690 |
| 5,294,870 A | 3/1994 | Tang et al. .................. 313/504 |
| 5,485,355 A | 1/1996 | Voskoboink et al. .......... 362/84 |
| 5,629,389 A | 5/1997 | Roitman et al. .............. 525/53 |
| 5,753,381 A | 5/1998 | Feldman et al. ............. 428/690 |
| 5,757,126 A | 5/1998 | Harvey, III et al. ......... 313/506 |
| 5,867,236 A | 2/1999 | Babuka et al. ................. 349/73 |
| 5,876,863 A | 3/1999 | Feldman et al. ............. 428/690 |
| 5,998,803 A | 12/1999 | Forrest et al. ................. 257/40 |
| 6,023,371 A | 2/2000 | Onitsuka et al. ............. 359/620 |
| 6,191,433 B1 | 2/2001 | Roitman et al. ............... 251/40 |
| 6,198,220 B1 | 3/2001 | Jones et al. .................. 313/512 |
| 6,228,228 B1 | 5/2001 | Singh et al. ............. 204/192.1 |
| 6,261,891 B1 | 7/2001 | Cheng et al. ................ 438/238 |
| 6,538,375 B1 | 3/2003 | Duggal et al. ............... 313/506 |

FOREIGN PATENT DOCUMENTS

| | | |
|---|---|---|
| WO | 0026973 | 5/2000 |
| WO | 0036665 | 6/2000 |

OTHER PUBLICATIONS

J. Kido et al., "Organic Electroluminescent Devices Based on Molecularly Doped Polymers", App. Phys. Lett., vol. 61, No. 7, 761–763 (1992).

P.F. Gordon and P. Gregory, Organic Chemistry in Colour, Sringer–Verlag, pp. 95–108 (1983).

H. Suzuki et al., "Near–Ultraviolet Electroluminiscence from Polysilanes", 331, Thin Solid Films, 64–70 (1998).

J. Kido et al., "White Light–Emitting Organic Electroluminescent Using the Poly(N.Vinylcarbazole) Emitter Layer Doped with Three Fluorescent Dyes", Appl. Phys. Lett., vol. 64, No. 7.

J. Kido et al., "Single–Layer White Light–Emitting Organic Electroluminescent Devices Based on Dye–dispensed Poly(N–Vinylcarbazole)", Appl. Phys. Lett., vol. 67, No. 16, pp. 2281–2283 (1995).

*Primary Examiner*—Joseph Williams
*Assistant Examiner*—Kevin Quarterman
(74) *Attorney, Agent, or Firm*—Toan P. Vo; Patrick K. Patnode

(57) ABSTRACT

An environmentally-stable organic electroluminescent ("EL") fiber comprises at least one layer of an organic EL material formed on a fiber, cable, or wire; associated electrodes for providing a voltage to activate the organic EL material; and a barrier layer formed around the EL and electrode materials for reducing the permeation of oxygen, water vapor, and other reactive materials into the underlying layers. The barrier layer comprises either (1) alternating sublayers of a polymeric material and an inorganic material, or (2) alternating sets of adjacent sublayers of polymeric materials and adjacent sublayers of inorganic materials. Color of light emitted from the fiber may be modified by one or more layers containing inorganic and/or organic phosphor materials.

42 Claims, 9 Drawing Sheets

ENVIRONMENTALLY-STABLE ORGANIC ELECTROLUMINESCENT FIBERS

CROSS REFERENCE TO RELATED APPLICATIONS

This application is a division of application Ser. No. 09/683,139, filed Nov. 27, 2001, now U.S. Pat. No. 6,753,096, which is hereby incorporated by reference in its entirety.

This patent application is related to patent application Ser. No. 09/640,950, entitled "An OLED Fiber Light Source," filed on Aug. 17, 2000.

BACKGROUND OF THE INVENTION

The present invention relates generally to electroluminescent organic fibers and devices. In particular, the present invention relates to environmentally stable electroluminescent organic fibers and devices and light sources comprising such fibers or devices.

Electroluminescent ("EL") devices, which may be classified as either organic or inorganic, are well known in graphic display and imaging art. EL devices have been produced in different shapes for many applications. Inorganic EL devices, however, typically suffer from a required high activation voltage and low brightness. On the other hand, organic EL devices ("OELDs"), which have been developed more recently, offer the benefits of lower activation voltage and higher brightness in addition to simple manufacture, and, thus, the promise of wider applications.

An OELD is typically a thin film structure formed on a substrate such as glass or transparent plastic. A light-emitting layer of a luminescent organic material and optional adjacent semiconductor layers are sandwiched between a cathode and an anode. The semiconductor layers may be either hole (positive charge)-injecting or electron (negative charge)-injecting layers. The material for the light-emitting layer may be selected from many luminescent organic materials. The light emitting layer may itself consist of multiple sublayers, each comprising a different luminescent material.

When a voltage is applied across the device, electrons are injected from the cathode into a layer of organic luminescent material. At the same time, holes (positively charges) are injected from the anode into the same layer of organic luminescent material. When the positive and negative charges meet in the layer of organic luminescent material, they recombine to form excited molecules or excitons that emit radiation (in the range from ultraviolet ("UV") to visible wavelengths) when they decay. Thus, the OELD emits radiation by electron-hole recombination due to direct electron and hole injection into the radiation-emitting layer, rather than by excitation of activator ions by electrons, as in inorganic EL devices. The wavelength, and consequently the color, of the photons emitted by the excitons depends on the electronic properties of the organic luminescent material from which the photons are generated.

Despite the aforementioned beneficial characteristics, wider acceptance for OELDs still awaits easily implementable solutions for their susceptibility to damage resulting from exposure to the environment such that robust OELDs may be made. The organic luminescent material can be reactive to moisture and oxygen. Such a reaction may cause a reduction in the useful life of the OELD. Oxidation sensitive cathode materials such as Mg—Al, Al—Li, or Ca are especially susceptible to atmospheric oxygen, which can produce dark, non-emitting spots in oxidized regions preventing current flow therethrough.

Attempts have been made to provide sealing structures for flat OELD panel displays. For example, U.S. Pat. No. 5,757,126 discloses a method for passivating a flat OELD comprising several OELD components arranged on common plastic substrate by depositing alternating layers of a transparent polymer and a dielectric material on the substrate to improve the barrier properties thereof. The transparent polymer is chosen from the group of fluorinated polymers, parylenes, and cyclotenes. The preferred dielectric materials for this device are silicon oxides and silicon nitride. PCT application WO 00/36665 discloses an flat organic light-emitting device encapsulated by at least one barrier stack comprising at least one barrier layer and one polymer layer. The material for the barrier layer is chosen from metal oxides, metal nitrides, metal carbides, metals oxynitrides, or combinations thereof. The polymer layer is made of acrylate-containing polymers. PCT application WO 00/26973 discloses a flat panel display based on inorganic and organic EL devices wherein the display EL medium is protected from oxidation by a layer that functions as both a barrier and an electrode. The layer consists of multiple alternating sublayers of barrier materials and conductive materials. The barrier materials include organic polymers, transparent dielectric materials, transparent metal nitrides, and transparent conductive oxides.

Flat-panel geometry is useful in some applications, but is not suitable in some others, such as those calling for flexible narrow shaped lighting sources. Some cable- or fiber-shaped light-emitting devices based on inorganic electroluminescent phosphors have been proposed for these applications. However, inorganic electroluminescent devices typically require high voltage and are less energy-efficient. Attempts have been made to protect these devices by coating them with an insulating polymer layer such as silicone, as disclosed in U.S. Pat. Nos. 5,753,381 and 5,876,863. Although some polymers, including silicone, can slow a penetration of liquid water, they still have appreciable permeability for water vapor and oxygen. However, effort has not been directed to improve the resistance to environmental damage of fiber-shaped OELDs.

Therefore, there still is a continued need for flexible cable- or fiber-shaped OELDs that are less affected by the environment. In particular, it is very desirable to provide a sealing structure for inhibiting the permeation of water vapor, oxygen, and/or other reactive materials into cable- or fiber-shaped OELDs or for substantially preventing these species to reach the sensitive or reactive components of OELDs.

SUMMARY OF THE INVENTION

The present invention provides a flexible and environmentally stable organic electroluminescent fiber and a method for producing the same. The terms "fiber" and "cable" are used herein in an interchangeable manner to mean a structure that has a large ratio of length to the largest dimension of a cross-section, such as a ratio greater than 10. The fiber or cable may have a circular or non-circular cross-section. When the cross-section is circular, the dimension of the cross-section to be considered is the diameter. When the cross-section is non-circular, the ratio is based on the largest dimension of the cross-sectional area.

An environmentally stable organic electroluminescent fiber (hereinafter also "organic light-emitting fiber" or "OLEF") of the present invention comprises a core that comprises a first electrically conducting material forming a first electrode; at least one layer of an organic electroluminescent material formed over and in direct or indirect contact with the first electrode; at least a layer of a second electrically conducting material forming a second electrode, the second electrode in a shape of a second electrode layer being formed over at least a portion of and in direct or indirect contact with the at least one layer of organic electroluminescent material; and at least one barrier layer formed over the second electrode layer surrounding the organic electroluminescent material and the second electrode, the at least one barrier layer comprising a plurality of sublayers of a polymeric material and an inorganic material. The OLEF of the present invention has a ratio of a length to a dimension of a cross-section of at least 10.

According to one aspect of the present invention, the barrier layer comprises a plurality of alternating sublayers of a polymeric material and an inorganic material.

According to another aspect of the present invention, the barrier layer comprises a plurality of alternating sets of adjacent sublayers of polymeric materials and adjacent sublayers of inorganic materials.

According to another aspect of the present invention, at least one additional layer of an organic material is disposed between an electrode layer and the layer of organic electroluminescent material to promote an injection of charges from the electrode into the layer of organic electroluminescent material.

According to another aspect of the present invention, a method for making an environmentally stable OLEF comprises the steps of: (1) providing an elongated fiber core of a core material that comprises a first electrically conducting material forming a first electrode; (2) depositing at least one layer of at least one organic electroluminescent material over and in direct or indirect contact with the first electrode; (3) depositing a layer of a second electrically conducting material over at least a portion of and in direct or indirect contact with the at least one layer of the at least one organic electroluminescent material to form a second electrode; and (4) depositing a barrier layer over the second electrode, the barrier layer comprising a plurality of sublayers of a polymeric material and an inorganic material and covering an effective area of the fiber to reduce a diffusion of environmental species into the OLEF.

According to another aspect of the present invention, the barrier layer comprises either (1) alternating sublayers of a polymeric material and an inorganic material, or (2) alternating sets of adjacent sublayers of polymeric materials and adjacent sublayers of inorganic materials.

According to another aspect of the present invention, the first electrically conducting material is deposited on at least a portion of an outer surface of the fiber core to form the first electrode.

According to another aspect of the present invention, a continuous process for making a flexible environmentally stable OLEF comprises the steps of: (1) winding from a first spool to a second spool a flexible fiber core comprising a first electrically conducting material that acts as a first electrode; (2) depositing at least one layer of at least one organic electroluminescent material over the first electrode layer while the fiber travels from the first spool to the second spool through a first deposition zone; (3) depositing a second electrically conducting material on at least a portion of a surface of the at least one layer of the at least one organic electroluminescent material while the fiber travels from the first spool to the second spool through a second deposition zone; and (4) depositing a plurality of sublayers of at least one sublayer of a polymeric material and at least one sublayer of an inorganic material over an entire surface of the fiber after step 3 while the fiber travels from the first spool to the second spool through at least a third deposition zone, the alternating sublayers comprising at least one barrier layer.

According to still another aspect of the present invention, an apparatus for continuous fabrication of an environmentally stable OLEF comprises: (1) means for winding a flexible fiber core member comprising a first electrically conducting material from a first spool to a second spool; (2) first means for depositing at least one layer of at least one organic electroluminescent material over the fiber core member and in contact with the first electrically conducting material to form a fiber of a first stage while the fiber core travels from the first spool to the second spool; (3) second means for depositing a second electrically conducting material over at least a portion of and in contact with the at least one organic electroluminescent material to form a fiber of a second stage while the fiber of the first stage travels from the first spool to the second spool; (4) third means for depositing a plurality of sublayers of a polymeric material and an inorganic material over the second electrically conducting material while the fiber of the second stage travels from the first spool to the second spool, the plurality of sublayers comprising at least a barrier layer.

Other features and advantages of the present invention will be apparent from a perusal of the following detailed description of the invention and the accompanying drawings in which the same numerals refer to like elements.

DETAILED DESCRIPTION OF THE INVENTION

The present invention provides a flexible and environmentally stable organic electroluminescent fiber and methods for producing the same. The term "flexible" means being capable of being bent into a curve having a radius of curvature smaller than 100 cm, preferably smaller than 50 cm, and more preferably smaller than 10 cm. As used herein, the terms "radiation," "electromagnetic radiation," and "light" are used interchangeably to mean electromagnetic ("EM") radiation having a wavelength in the range from UV to infrared ("IR"); i.e, from about 100 nm to about 1 mm. An OLEF of the present invention has an outer sealing structure that substantially inhibits the permeation of water vapor, oxygen, and other reactive materials into the internal sensitive and reactive layers of the fiber, thereby can increase the useful life thereof.

Figure 1:
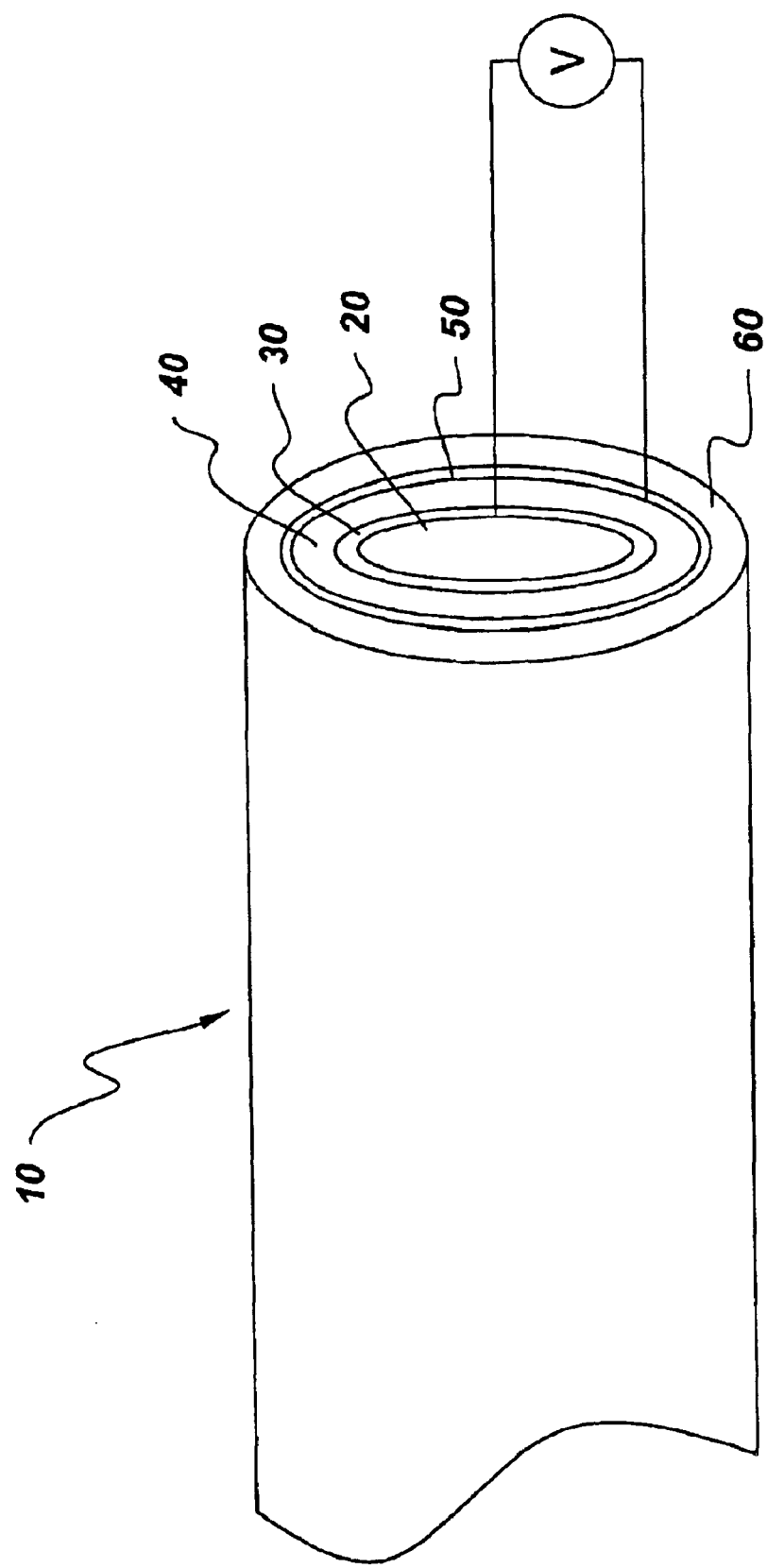
FIG. 1 shows a perspective view of the cross section of a first embodiment of an OLEF of the present invention.
Figure 2:
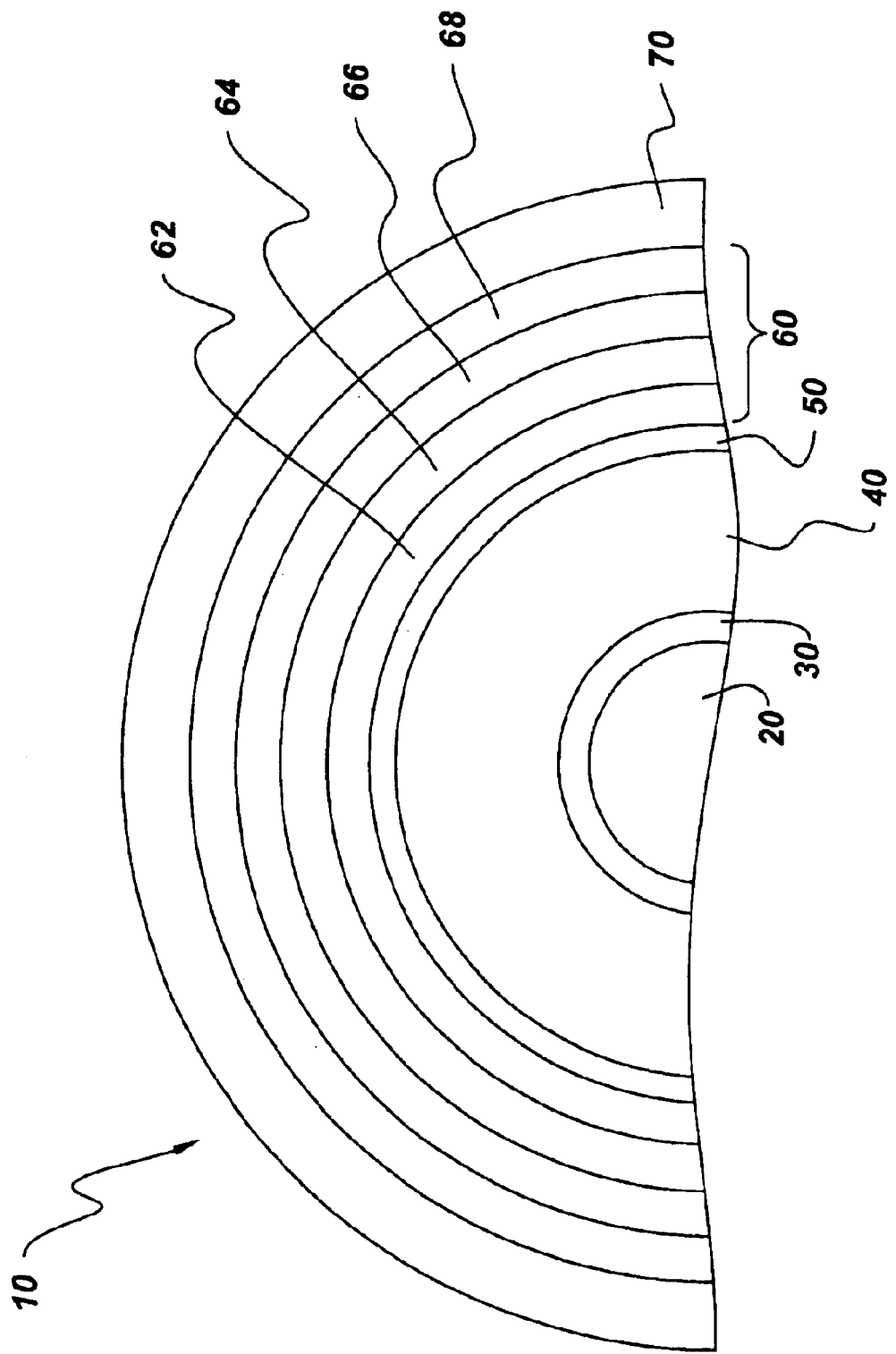
FIG. 2 shows a partial cross section of a second embodiment of an OLEF of the present invention.

FIG. 1 is a perspective view of a first embodiment of an OLEF 10 of the present invention. OLEF 10 has a multilayer construction and comprises a flexible core 20 which may be made of glass or a polymeric or metallic fiber, cable, or wire. Flexible core 20 has a diameter that is suitable for the specific application to which the final OLEF 10 is put to use. For example, the core diameter may be on the order of 0.001 to about 10 millimeters. When fiber core 20 is made of a polymeric material, a layer 30 of a first electrically conducting material is deposited on fiber core 20 to form a first electrode layer. The first electrode layer 30 covers substantially the length of the fiber and at least a portion of the circumferential surface of the fiber. When fiber core 20 is made of a metallic wire or cable having suitable electrical conductivity, layer 30 may be omitted. At least one layer 40 of an organic electroluminescent material is deposited on electrode layer 30 (or on fiber core 20 when it is made of a metal that can serve as the first electrode). A layer 50 of a second electrically conducting material acting as a second electrode is formed over and in contact with the at least one organic electroluminescent layer 40. Layer 50 is made of a radiation transmissive material and preferably covers substantially the whole outer surface of the at least one organic electroluminescent layer 40. Suitable materials for flexible core 20 and layers 30, 40, and 50 will be disclosed below. The fiber having first electrode layer 30, at least one organic electroluminescent layer 40, and second electrode layer 50 is sealed by a barrier layer 60. Barrier layer 60 is constructed of a plurality of alternating sublayers of a polymer and an inorganic material having low permeability of water vapor, oxygen, and other reactive materials. In a preferred embodiment, the entire fiber is further encapsulated in a radiation transmissive encapsulating layer 70 that is deposited on barrier layer 60, as shown in FIG. 2. FIG. 2 shows barrier 60 consisting of four sublayers 62, 64, 66, and 68. However, any number of sublayers greater than 2 is within the scope of the present invention. Encapsulating layer may be suitably made of a substantially transparent polymeric material that has good weatherability, such as silicone or epoxy.

An OLEF of the present invention may have any desirable cross-sectional shape, such as circular, oval, or polygonal cross section and has a ratio of length to the largest dimension of the cross section of greater than 10.

Elements 20, 30, 40, 50, 60, and 70 of an OLEF of the present invention may comprise any suitable materials. The flexible core member 20 may comprise a flexible polymeric or metallic material. Suitable polymeric materials for fiber core member 20 are polyolefins such as polyethylene, polypropylene, or polytetrafluoroethylene; polysiloxane; epoxy; polyacrylate; polyethyleneterephthalate; and derivatives thereof. Fiber core element 20 may comprise a glass or a metal such as aluminum, copper, or steel. The core member 20 has a diameter (or a largest dimension of the cross section for non-circular cross sections) of about 1 micrometer to about 10 mm, preferably about 10 micrometers to about 2 mm, and more preferably about 100 micrometers to about 1 mm.

When a voltage is applied across electrodes layers 30 and 50, charge carriers (i.e, electrons and holes) are injected into organic electroluminescent layer 40, where the charge carriers recombine to form excited molecules which emit radiation when they decay to lower-energy states. Typically, the applied voltage is in the range from about 2 to about 10 V. The thickness of electrode layers 30 and 50 is typically in the range from about 50 nm to about 500 nm, preferably from about 50 nm to about 200 nm.

In one embodiment of the present invention, electrode layer 30 is a cathode injecting negative charge carriers (electrons) into the organic layer 40 and is made of a material having a low work function; e.g., less than about 4 eV. Materials suitable for use as a cathode are K, Li, Na, Mg, La, Ce, Ca, Sr, Ba, Al, Ag, In, Sn, Zn, Zr, alloys thereof, or mixtures thereof. Preferred materials for the manufacture of cathode layer 30 are Ag—Mg, Al—Li, In—Mg, and Al—Ca alloys.

Figure 3:
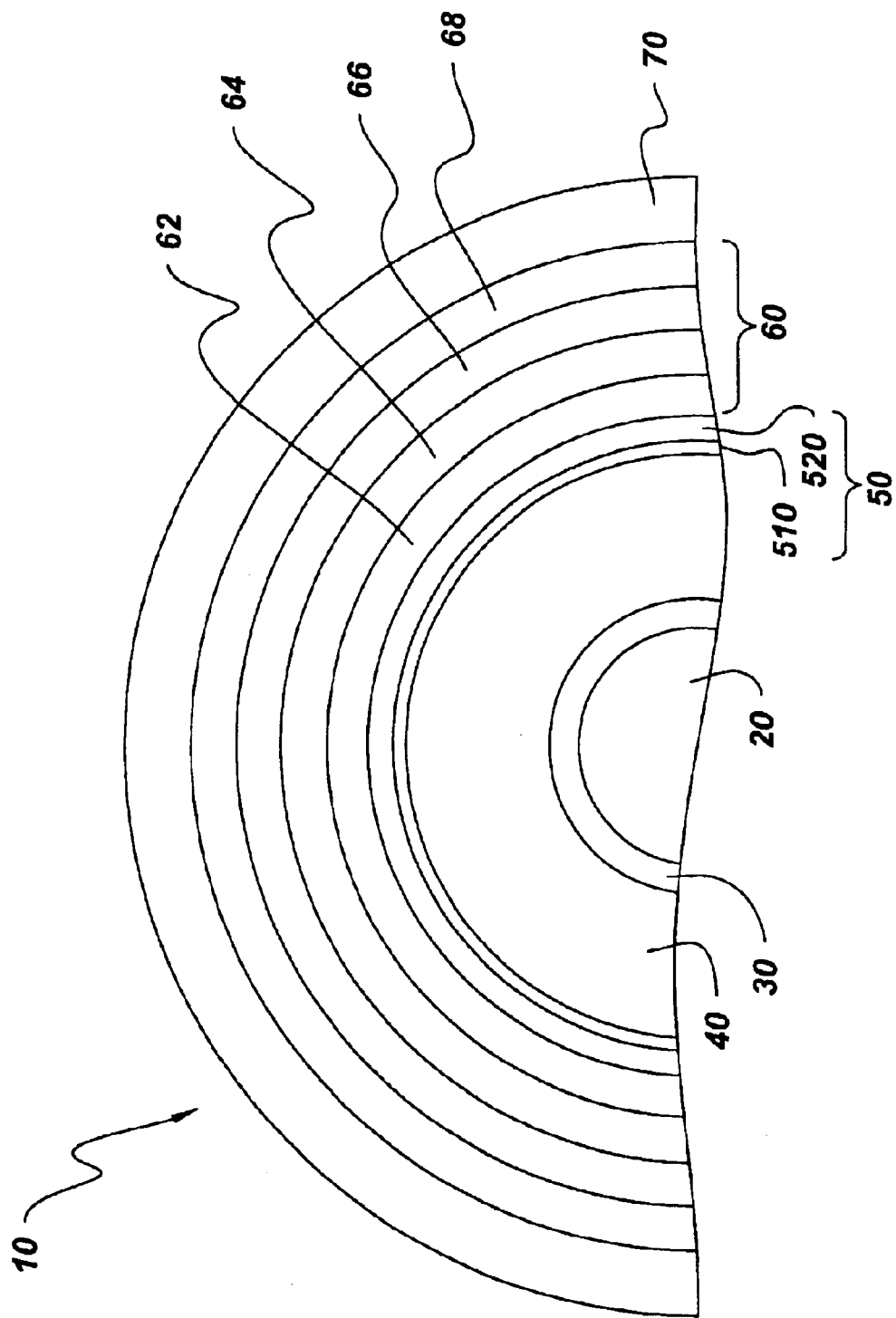
FIG. 3 shows a partial cross section of a third embodiment of an OLEF of the present invention.

In this embodiment, electrode layer 50 is an anode injecting positive charge carriers (or holes) into organic layer 40 and is made of a material having a high work function; e.g., greater than about 4.5 eV, preferably from about 4.5 eV to about 5 eV. Indium tin oxide ("ITO") is typically used for this purpose. ITO is substantially transparent to light transmission and allows at least 80% light transmitted therethrough. Therefore, light emitted from organic electroluminescent layer 40 can easily escape through the ITO anode layer without being seriously attenuated. Other materials suitable for use as the anode layer are tin oxide, indium oxide, zinc oxide, indium zinc oxide, and mixtures thereof. Anode 50 may also be made of a thin metal layer such as a layer of Pt, Pd, Ag, or Au. In this case, the thickness of anode layer 50 is preferably kept such that light emitted from organic EL layer 40 is not seriously attenuated as it travels through anode layer 50. In one embodiment shown in FIG. 3, anode 50 comprises a layer 510 of a metal such as Pt, Pd, Ag, Au, a mixture thereof, or an alloy thereof, and a layer 520 of a conductive oxide such as ITO, tin oxide, indium oxide, zinc oxide, indium zinc oxide, or a mixture thereof. Electrode layers 30 and 50 may be deposited on the underlying element by physical vapor deposition, chemical vapor deposition, or sputtering.

Figure 4:
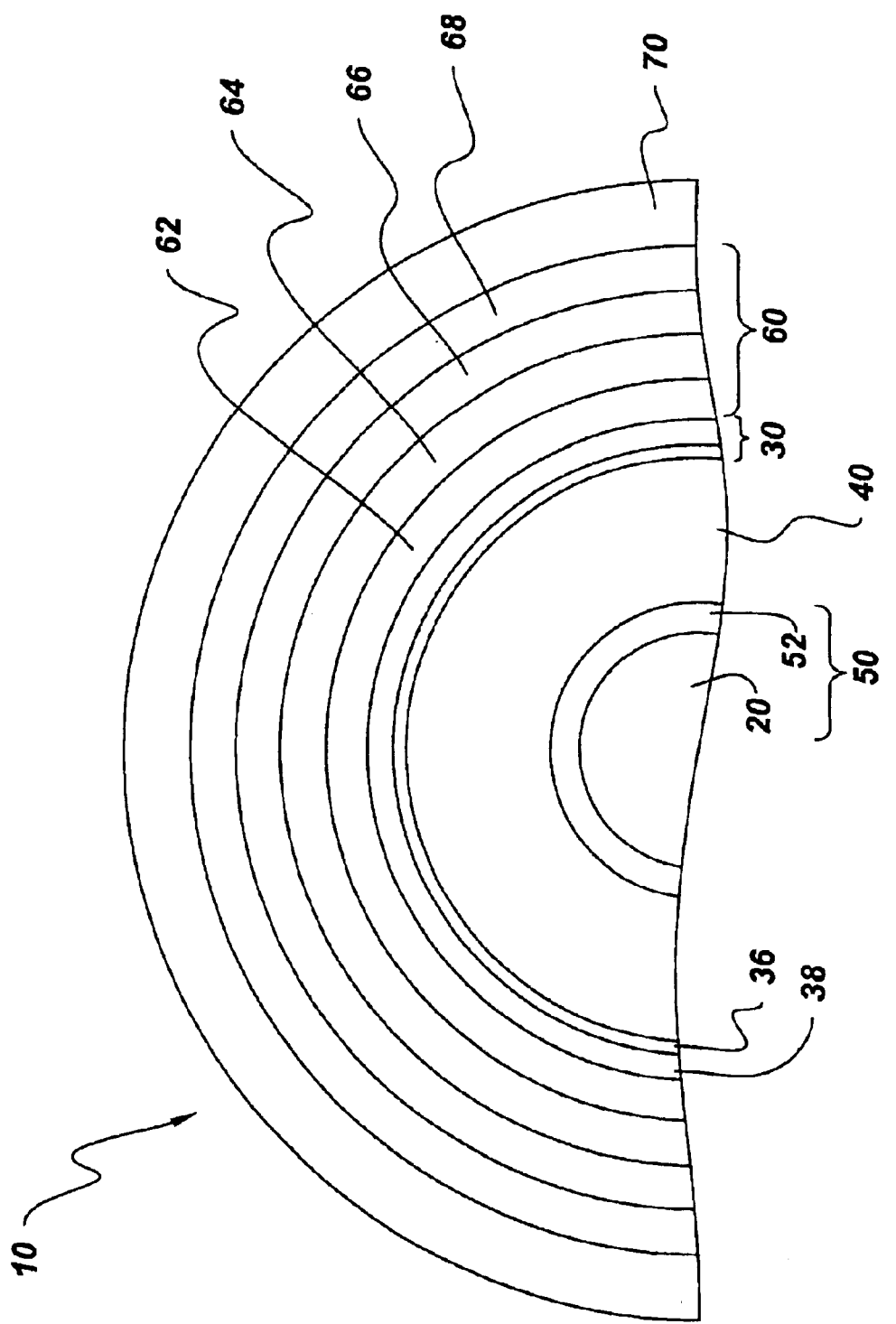
FIG. 4 shows a partial cross section of a fourth embodiment of an OLEF of the present invention.
Figure 5:
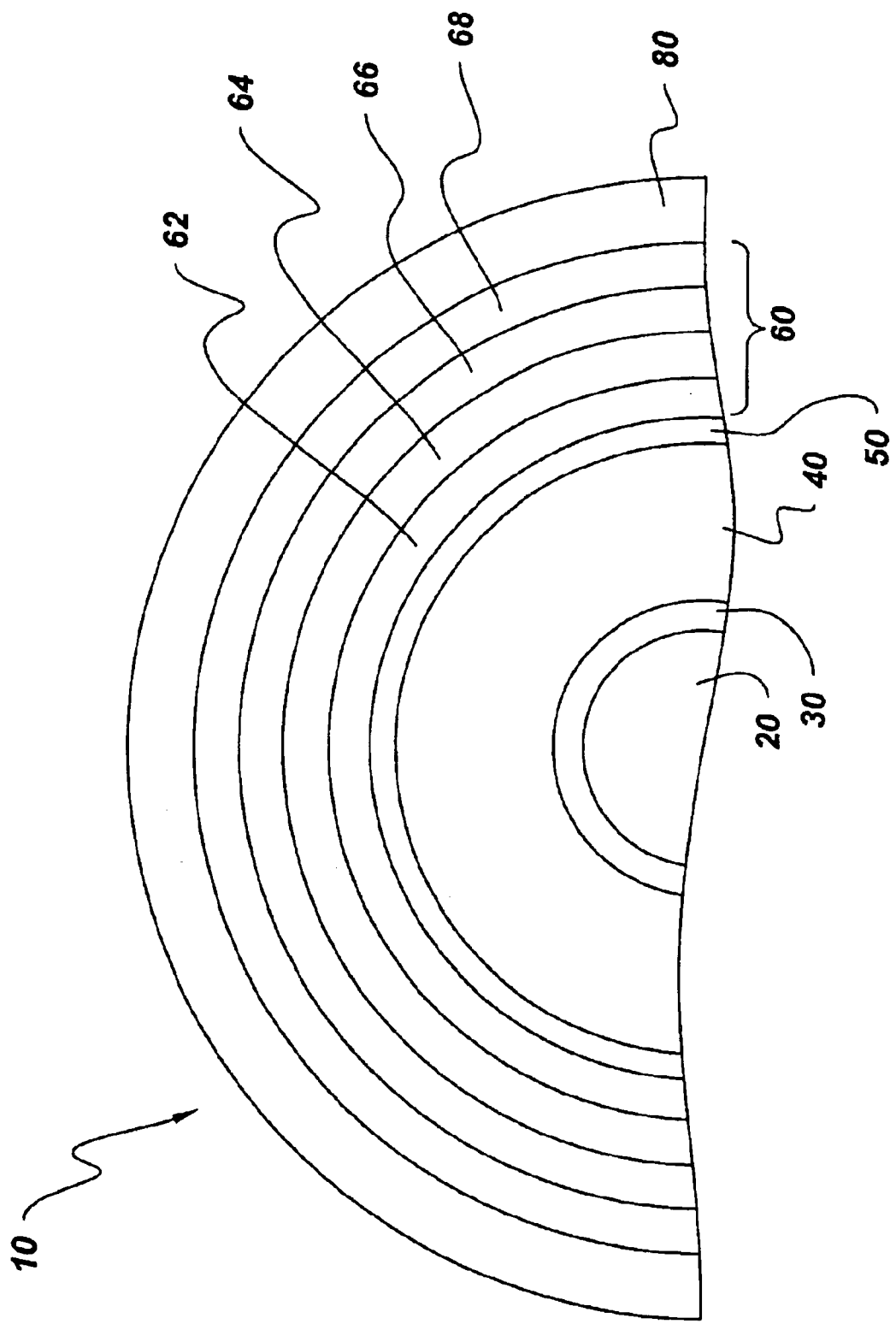
FIG. 5 shows a partial cross section of a fifth embodiment of an OLEF of the present invention.

Although the preferred order of the cathode and anode layers is disclosed above, the electrode layers may be reversed. Electrode layers 30 and 50 may serve as the anode and cathode, respectively. In this configuration, the thickness of cathode layer 30 is preferably kept to a minimum so that light emitted from organic layer 40 is not seriously attenuated as it travels through cathode layer 30. FIG. 4 shows the cross section of an OLEF of this configuration. Fiber core 20 may comprise an electrically conducting material suitable for acting as an anode. A layer 52 of a metal such as Pt can be disposed on at least a portion of fiber core 20 to increase the work function of the anode. Fiber core 20 and metal layer 52 together constitute anode 50. Cathode layer 30 can comprise a layer 36 of LiF and a layer 38 of a metal such as aluminum. Other layers shown in FIG. 4 will be described in detail below.

Organic EL layer 40 serves as the transport medium for both holes and electrons. In this layer these excited species combine and drop to a lower energy level, concurrently emitting EM radiation in the visible range. Organic EL materials are chosen to electroluminescent in the desired wavelength range. The thickness of the organic EL layer 40 is preferably kept in the range of about 100 to about 300 nm. The organic EL material may be a polymer, a copolymer, a mixture of polymers, or lower molecular-weight organic molecules having unsaturated bonds. Such materials possess a delocalized $\pi$-electron system, which gives the polymer chains or organic molecules the ability to support positive and negative charge carriers with high mobility. Suitable EL polymers are poly(n-vinylcarbazole) ("PVK", emitting violet-to-blue light in the wavelengths of about 380–500 nm); poly(alkylfluorene) such as poly(9,9-dihexylfluorene) (410–550 nm), poly(dioctylfluorene) (wavelength at peak EL emission of 436 nm), or poly[9,9-bis(3,6-dioxaheptyl)-fluorene-2,7-diyl] (400–550 nm); poly(praraphenylene) derivatives such as poly(2-decyloxy-1,4-phenylene) (400–550 nm). Mixtures of these polymers or copolymers based on one or more of these polymers and others may be used to tune the color of emitted light.

Another class of suitable EL polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly(methylphenylsilane), and poly[bis(p-butylphenyl)silane] which are disclosed in H. Suzuki et al., "Near-Ultraviolet Electroluminescence From Polysilanes," 331 Thin Solid Films 64–70 (1998). These polysilanes emit light having wavelengths in the range from about 320 nm to about 420 nm.

Organic materials having molecular weight less than about 5000 that are made of a large number of aromatic units are also applicable. An example of such materials is 1,3,5-tris[n-(4-diphenylaminophenyl)phenylamino]benzene, which emits light in the wavelength range of 380–500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis[2,6-di(t-butyl)phenoxide] or scandium-(4-methoxy-picolylmethylketone)-bis(acetylacetonate), which emits in the range of 420–433 nm, or tris(8-quinolinolato)-aluminum III ("Alq") having peak emission in the range of about 500–550 nm. Organic EL layer 40 may comprise a polymer carrier doped with one or more of these lower molecular weight organic molecules or organic complexes. The polymer may be chosen from a wide range of molecular weights that can offer the desired formulation for the particular circumstance.

In one embodiment of the present invention, at least one phosphor or photoluminescent material may be used to shift the wavelength of the light emitted by the organic EL layer. The phosphor material may be of an inorganic or organic type and is dispersed in a film-forming material, such as an inert polymer precursor, to form a phosphor layer 80 on the outer surface of barrier layer 60. A preferred material for layer 80 is poly(methylmethacrylate). The inorganic phosphor particles may be prepared from larger pieces of phosphor material by any grinding or pulverization method, such as ball milling using zirconia-toughend balls or jet milling. They also may be prepared by crystal growth from solution, and their size may be controlled by terminating the crystal growth at an appropriate time. The preferred phosphor materials efficiently absorb EM radiation emitted by the organic EL material and re-emit light in another spectral region. Such a combination of the organic EL material and the phosphor allows for a flexibility in tuning the color of light emitted by the OLEF device. A particular phosphor material may be chosen to emit a desired color. A mixture of phosphors such as those emitting blue, green, and red light may be used if a white light is desired. An exemplary inorganic phosphor is the cerium-doped yttrium aluminum oxide $Y_3Al_5O_{12}$ garnet ("YAG"). Other suitable inorganic phosphors are based on YAG doped with more than one type of rare earth ions, such as $(Y_{1-x-y}Gd_xCe_y)_3Al_5O_{12}$ ("YAG:Gd,Ce"), $(Y_{1-x}Ce_x)_3(Al_{1-y}Ga_y)O_{12}$ ("YAG:Ga,Ce"), $(Y_{1-x-y}Gd_xCe_y)(Al_{5-z}Ga_z)O_{12}$ ("YAG:Gd,Ga,Ce"), and $(Gd_{1-x}Ce_x)Sc_2Al_3O_{12}$ ("GSAG") where $0 \leq x \leq 1$, $0 \leq y \leq 1$, $0 \leq z \leq 5$ and $x+y \leq 1$. For example, the YAG:Gd,Ce phosphor shows an absorption of light in the wavelength range from about 390 nm to about 530 nm (i.e., the blue-green spectral region) and an emission of light in the wavelength range from about 490 nm to about 700 nm (i.e., the green-to-red spectral region). The following are examples of phosphors that are efficiently excited by EM radiation emitted in the wavelength region of 300 nm to about 500 nm by polysilanes and their derivatives.

Green-emitting phosphors: $Ca_8Mg(SiO_4)_4Cl_2:Eu^{2+}, Mn^{2+}$; $GdBO_3:Ce^{3+}, Tb^{3+}$; $CeMgAl_{11}O_{19}:Tb^{3+}$; $Y_2SiO_5:Ce^{3+},Tb^{3+}$; and $BaMg_2Al_{16}O_{27}:Eu^{2+},Mn^{2+}$.

Red-emitting phosphors: $Y_2O_3:Bi^{3+},Eu^{3+}$; $Sr_2P_2O_7:Eu^{2+}, Mn^{2+}$; $SrMgP_2O_7:Eu^{2+},Mn^{2+}$; $(Y,Gd)(V,B)O_4:Eu^{3+}$; and $3.5MgO.0.5MgF_2.GeO_2:Mn^{4+}$.

Blue-emitting phosphors: $BaMg_2Al_{16}O_{27}:Eu^{2+}$ and $Sr_5(PO_4)_{10}Cl_2:Eu^{2+}$.

Still other ions may be incorporated into the inorganic phosphor to transfer energy from the light emitted from the organic material to other activator ions in the phosphor host lattice as a way to increase the energy utilization. For example, when $Sb^{3+}$ and $Mn^{2+}$ ions exist in the same phosphor lattice, $Sb^{3+}$ efficiently absorbs light in the blue region, which is not absorbed very efficiently by $Mn^{2+}$, and transfers the energy to $Mn^{2+}$ ion. Thus, a larger total amount of light emitted by the organic EL material is absorbed by both ions, resulting in higher quantum efficiency of the total device.

A phosphor composition of less than about 30, preferably less than about 10, percent by volume of the mixture of film-forming material and phosphor is used. A solvent may be added into the mixture to adjust the viscosity of the film-forming material to a desired level. The mixture of the film-forming material and phosphor particles is applied by conventional techniques such as spray coating or dip coating.

Organic phosphors or photoluminescent ("PL") materials may be used similarly to shift the wavelength of light emitted from the OLEF. Suitable organic PL materials for being incorporated into a light-emitting device 10 of the present invention absorb a portion of the light emitted by the organic EL material in a shorter wavelength range and emit light in a longer wavelength range in the visible spectrum. These organic PL materials typically have rigid molecular structure and are extended π-systems. They typically have small Stokes shifts and high quantum efficiency. For example, organic PL materials that exhibit absorption maxima in the blue portion of the spectrum exhibit emission in the green portion of the spectrum. Similarly, those that exhibit absorption maxima in the green portion of the spectrum exhibit emission the yellow or orange portion of the spectrum.

Suitable classes of organic PL materials are the perylenes and benzopyrenes, coumarin dyes, polymethine dyes, xanthene dyes, oxobenzanthracene dyes, and perylenebis (dicarboximide) dyes disclosed by Tang et al. in U.S. Pat. No. 4,769,292 which is incorporated herein by reference. Other suitable organic PL materials are the pyrans and thiopyrans disclosed by Tang et al. in U.S. Pat. No. 5,294,870 which is incorporated herein by reference. Still other suitable organic PL materials belong to the class of azo dyes, such as those described in P. F. Gordon and P. Gregory, "Organic Chemistry in Colour," Springer-Verlag, Berlin, pp. 95–108 (1983). Preferred organic PL materials are those that absorb a portion of the green light emitted by the light-emitting member and emit in the yellow-to-red wavelengths of the visible spectrum. Such emission from these organic PL materials coupled with the portion of unabsorbed light from the organic EL material can produce light that is close to the black-body radiation locus.

In an alternative embodiment of the present invention, the inorganic and/or organic phosphors may be dispersed in the organic EL layer 40.

More than one organic EL layer may be formed successively one on top of another. Each organic EL may have a different type of phosphor dispersed therein. For example, a particular organic EL material for a layer may be chosen to match its emission wavelength to the absorption wavelength of the phosphor dispersed therein. Thus, the color of the device may be further controlled.

Figure 6:
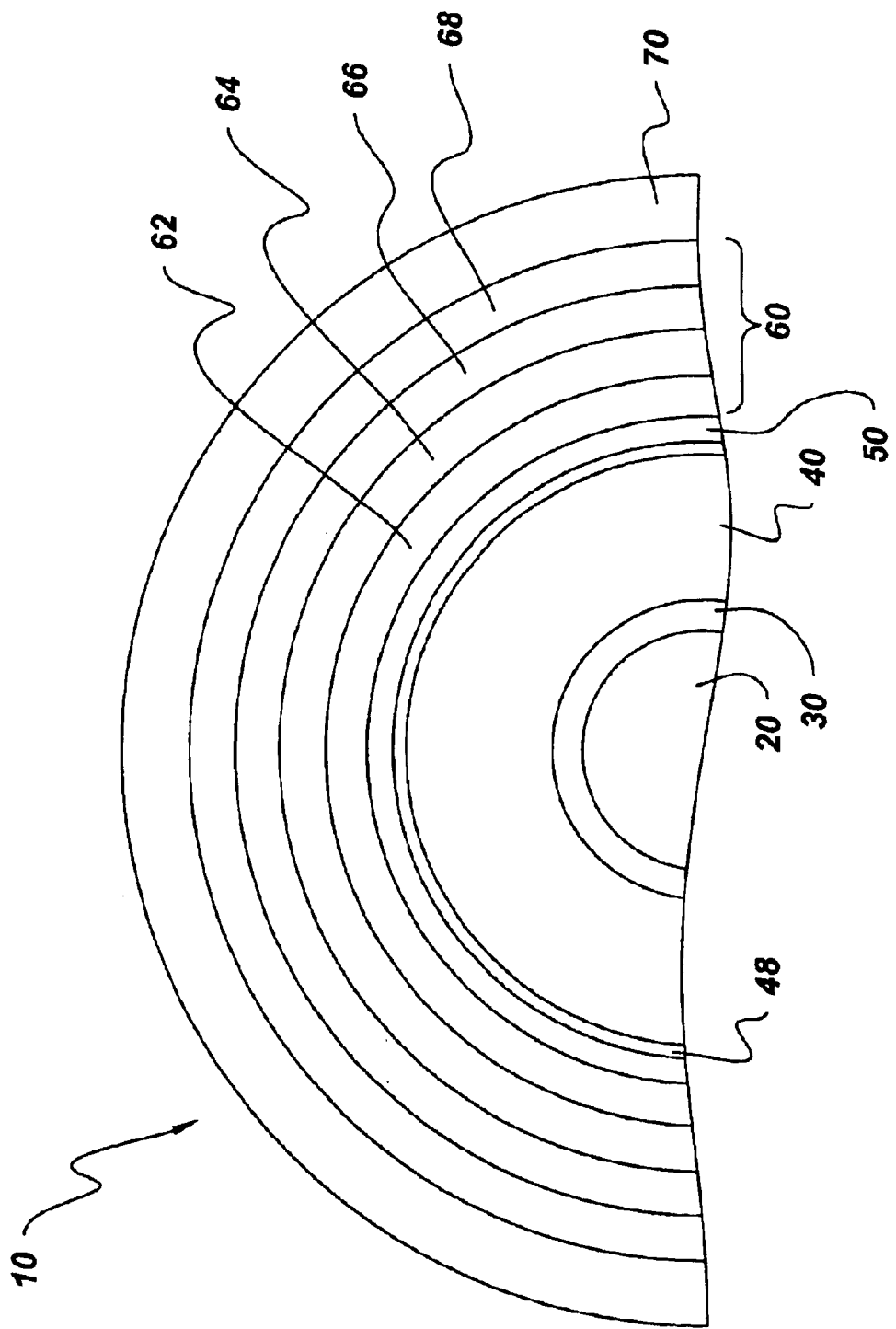
FIG. 6 shows a partial cross section of a sixth embodiment of an OLEF of the present invention.

Furthermore, one or more additional layers may be included to increase the efficiency of the overall device. For example, these additional layers can serve to improve the injection (electron or hole injection enhancement layers) or transport (electron or hole transport layers) of charges into the organic EL layer. The thickness of each of these layers is kept to below 500 nm, preferably below 100 nm. The layers may be applied during the manufacture of the OLEF by conventional methods such as spray coating, dip coating, or physical or chemical vapor deposition. In one embodiment of the present invention, as shown in FIG. 6, a hole injection enhancement layer 48 is formed between the anode layer 50 and the organic EL layer 40 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9,10-perylenetetra-carboxylic dianhydride or bis(1,2,5-thiadiazolo)-p-quinobis(1,3-dithiole).

Figure 7:
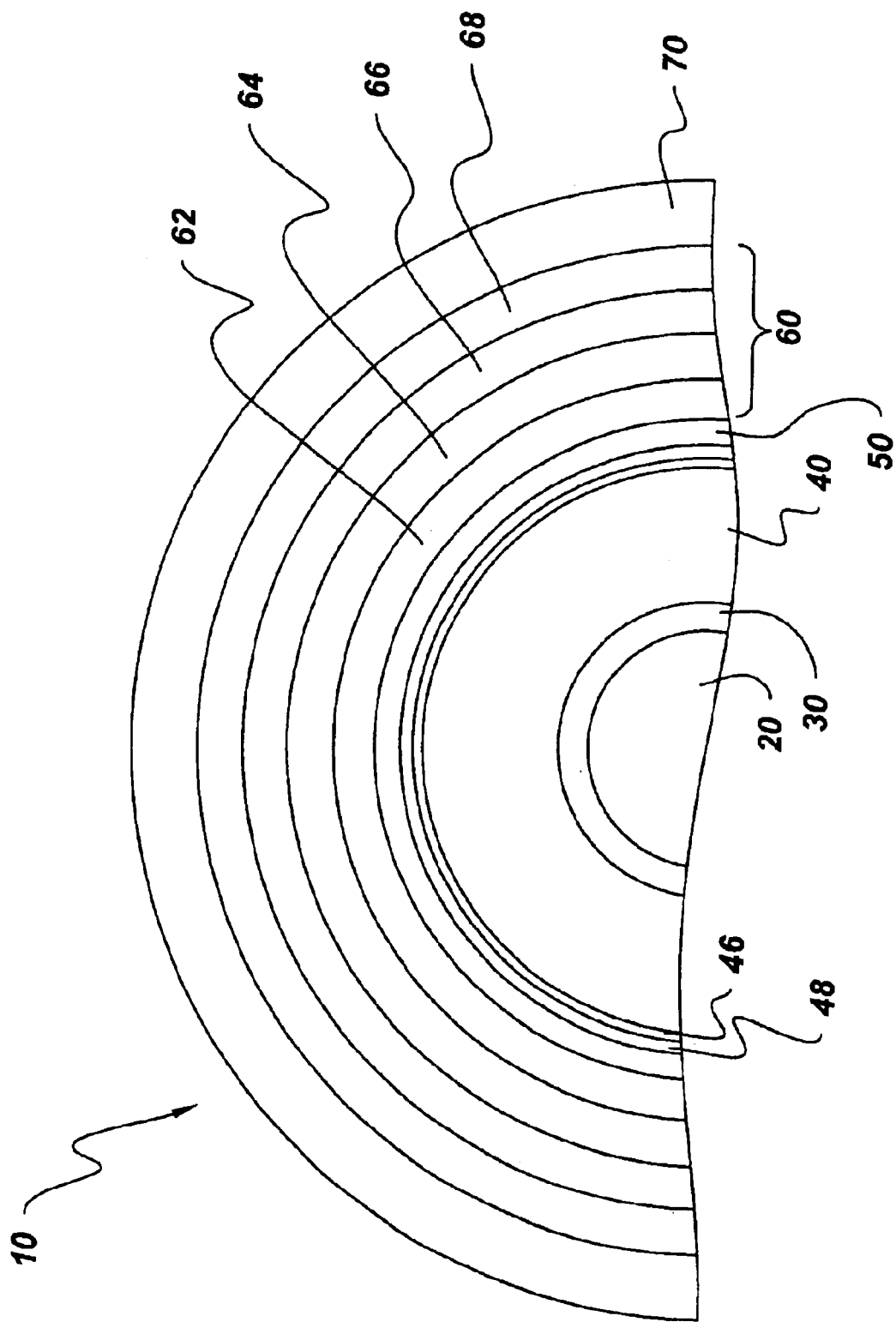
FIG. 7 shows a partial cross section of a seventh embodiment of an OLEF of the present invention.

In another embodiment of the present invention, as shown in FIG. 7, the OLEF 10 further includes a hole transport layer 46 which is disposed between the hole injection enhancement layer 48 and the organic EL layer 40. The hole transport layer 46 has the functions of transporting holes and blocking the transportation of electrons so that holes and electrons are optimally combined in the organic EL layer 40. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Figure 8:
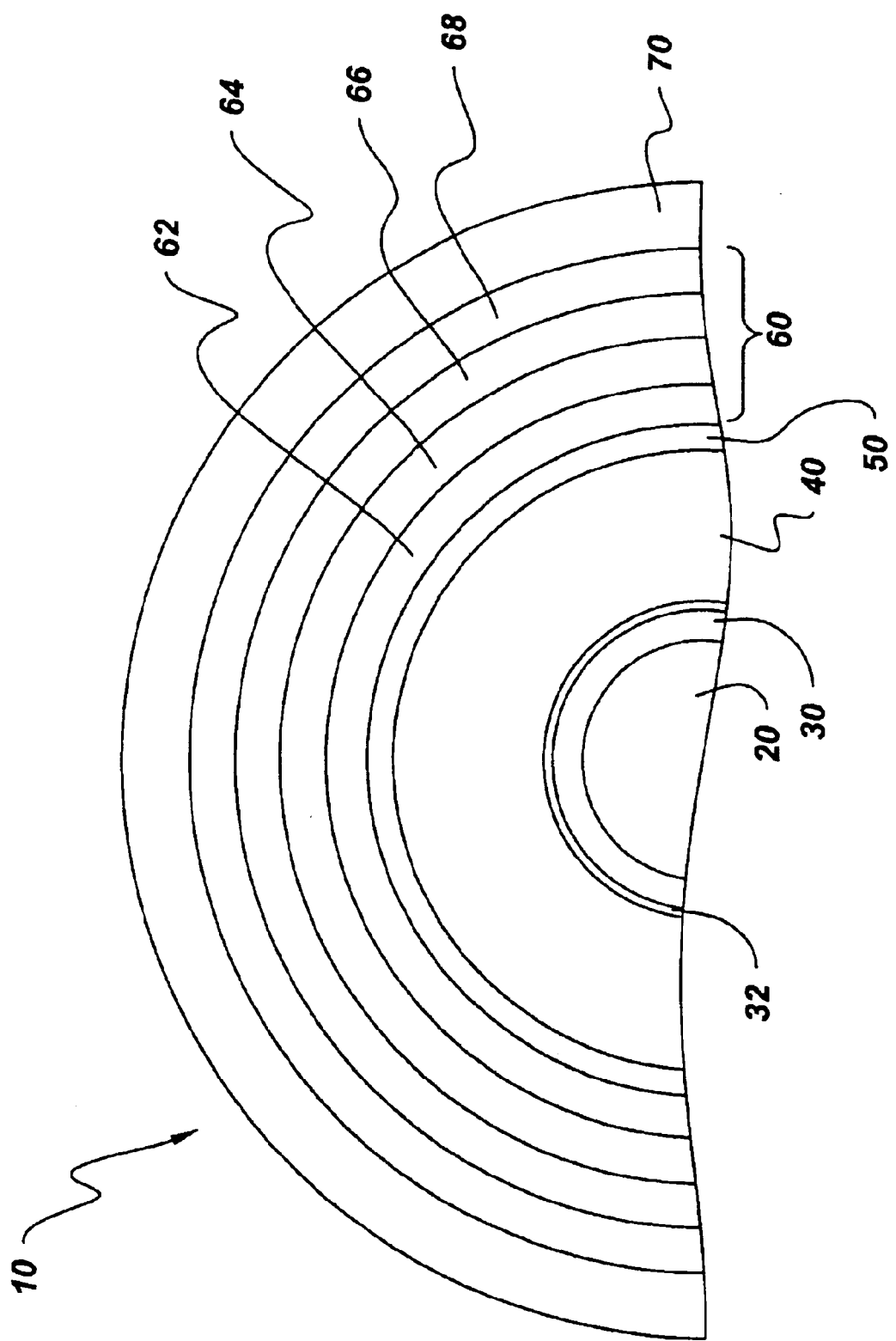
FIG. 8 shows a partial cross section of an eighth embodiment of an OLEF of the present invention.

In still another embodiment of the present invention, as shown schematically in FIG. 8, OLEF 10 includes an additional layer 32 which is disposed between the cathode layer 30 and the organic EL layer 40. Layer 32 has the combined function of injecting and transporting electrons to the organic EL layer. Materials suitable for the electron injecting and transporting layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371.

When one or more additional layers other than the organic EL layer are included in the OLEF, such as for hole injection enhancement, hole transport, electron injection enhancement and transport, particles of one or more inorganic phosphors or molecules of organic phosphors disclosed above may be dispersed therein. An exemplary purpose for such an inclusion of one or more phosphors is to further tune the color (i.e., to adjust the wavelength) of the light emitted from the OLEF.

In addition to barrier 60, OLEF 10 may be desirably encapsulated in a substantially transparent and thin layer 70 of a polymeric material to further retard the negative impact of oxygen, moisture, and/or other reactive materials from the environment on the useful life of the OLEF. This thin encapsulating layer 70 may be formed by any conventional technique such as spray coating, dip coating, physical vapor deposition, or chemical vapor deposition, followed by curing.

Barrier 60 is the principal element for inhibiting the permeation of moisture and oxygen into the OLEF that can adversely affect the sensitive electrode and organic EL layers. Barrier comprises a plurality of alternating sublayers (for example, 62, 64, 66, and 68) of at least one sublayer of a substantially transparent polymeric material and at least one sublayer of a substantially transparent inorganic material. The permeation rates of moisture and oxygen decrease as the number of alternating sublayers increases. Although FIGS. 2–8 show four sublayers 62, 64, 66, and 68, any number of sublayers greater than two is suitable for the reduction of permeation of moisture and oxygen. The polymeric sublayers reduce the permeation rates of gases through barrier 60 by reducing the number of straight-through paths resulting from defects in the inorganic sublayers upon which or under which the polymeric sublayer is formed. When the barrier layer includes more than one polymeric sublayer and more than one inorganic sublayers, different polymers and inorganic materials may be advantageously used for the individual sublayers. Alternatively, two or more polymeric sublayers comprising different polymers or two or more inorganic sublayers comprising different inorganic materials may be disposed adjacent to each other as long as at least one set of such polymeric sublayers and one set of such inorganic sublayers are alternatingly included in the structure of barrier layer 60. The thickness of each sublayer is typically in the range from about 1 to about 2000 nm, more preferably from about 5 to 1000 nm, and most preferably from about 10 nm to about 200 nm. The polymeric sublayer may be formed by physical vapor deposition, chemical vapor deposition, dip coating, or spray coating of the monomer, followed by polymerization. Physical or chemical vapor deposition may be desirably conducted under a subatmospheric pressure, for example, to minimize an introduction of unwanted molecules in the growing sublayers. The inorganic sublayer may be formed by physical vapor deposition, chemical vapor deposition, sputtering, or plasma-enhanced chemical vapor deposition ("PECVD"). In addition, metallic layers may be deposited by an electroplating process.

Examples of materials suitable for forming the polymeric sublayers are polyacrylates such as polymers or copolymers of acrylic acid, methacrylic acid, esters of these acids, halogenated acrylics, or acrylonitrile; poly(vinyl fluoride); poly(vinylidene chloride); epoxies; poly(vinyl alcohol); copolymer of vinyl alcohol and glyoxal (also known as ethanedial or oxaaldehyde); polyethyleneterephthalate ("PET"); parylenes; and polymers derived from cycloolefins and their derivatives, such as various poly(arylcyclobutene) disclosed in U.S. Pat. No. 4,540,763; the content of which is incorporated herein by reference. Preferably, the polymeric material is one of polyacrylates.

Examples of materials suitable for forming the inorganic sublayers are metals (the thickness of such metallic films being small enough to render the film substantially transparent), metal oxides, and metal nitrides. Examples of metals are aluminum, silver, copper, gold, platinum, palladium, and alloys thereof. Preferred metals are aluminum and silver. Examples of metal oxides are ITO, tin oxide, silicon oxides, cadmium oxide, indium oxide, zinc oxide, aluminum oxide, magnesium oxide, composites thereof, and solutions thereof. Preferred metal oxides are ITO, tin oxide, and silicon oxides. Examples of metal nitrides are nitrides of Groups IVA, VA, VIA, IIIB, and IVB of the Periodic Table. Preferred metal nitrides are silicon nitride and silicon oxynitride.

A method of making an environmentally stable OLEF of the present invention is now described. An elongated fiber core of a core material is provided. The fiber core comprises a first electrically conducting material and may be a flexible fiber, cable, or wire made of a metal. In this case, the fiber core itself also acts as the first electrode, such as a cathode. The fiber core also may be made of glass or a polymeric material. In this case, the first electrically conducting material is deposited on at least a portion of the circumferential surface of the fiber core and, preferably, on the entire length of the fiber core. At least one layer of at least one organic EL material is then deposited on the first electrically conducting material, preferably surrounding the entire surface of the fiber. A plurality of layers of different organic EL materials may formed sequentially on the underlying fiber, each providing a different emission spectrum. Moreover, each organic EL layer may comprise a different phosphor that absorbs a particular radiation wavelength range and emits EM radiation having a different wavelength range. An EM radiation transmissive second electrically conducting material is then deposited on the outermost organic EL layer to serve as the second electrode, for example an anode. A barrier layer is then deposited on the second electrically conducting material and completely surrounds the fiber with various underlying layers already formed. The barrier is formed by depositing alternating sublayers or series of sublayers of one or more polymeric materials and sublayers of one or more inorganic materials completely around the fiber. Preferably, the sublayers of organic materials and inorganic materials are deposited in alternating order. A power source is then connected to the electrodes to provide an electrical potential across the organic EL material to drive the light-emitting device. In one embodiment of the present invention, a encapsulating layer of a substantially transparent polymeric material is deposited on the entire fiber to further provide enhance the weatherability of the device.

Figure 9:
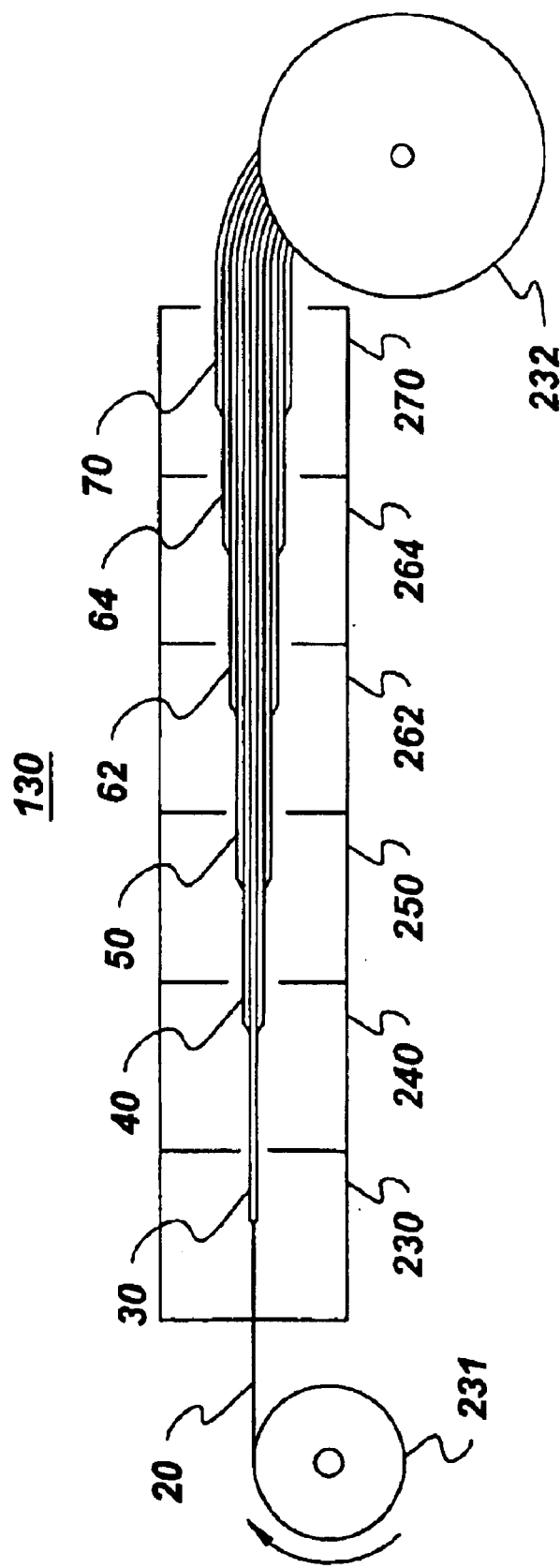
FIG. 9 shows a schematic diagram of an apparatus for carrying out a continuous process for fabricating an OLEF of the present invention.

A preferred method of making an environmentally-stable flexible OLEF comprises a "spool-to-spool" process as illustrated in FIG. 9 (in which various elements of the apparatus are not drawn to scale). The method comprises the following steps. First, the flexible fiber core member 20 comprising a first electrically conducting material, such as a material for a cathode, is wound from a first spool 231 to a second spool 232 in a coating apparatus 130. As discussed above, if the core member 20 is entirely non-conducting, a layer 30 of a first electrically conducting material is first deposited on at least a portion of the circumferential surface of the fiber core member and, preferably, on the entire length of the fiber core member 20 in deposition zone 230. If the fiber core member 20 is of an electrically conducting material, it may serve as the first electrode and deposition zone 230 may be eliminated from the apparatus 130. Alternatively, another electrically conducting material; for example, one that has a higher electrical conductivity, may be desirably deposited in deposition zone 230 on at least a portion of the circumferential surface of the fiber core member to enhance the electrical conduction throughout the length of the fiber core member. The spools 231 and 232 may have the same size or different sizes. The spools 231 and 232 rotate in tandem to transfer the flexible fiber core with layers deposited thereon from the first spool 231 to the second spool 232.

The flexible fiber core moves through different deposition zones or stations of the deposition apparatus 130, where each layer is sequentially deposited. Preferably, each deposition zone comprises a discrete deposition chamber of the apparatus 130. At least one organic EL layer 40 is deposited on first electrically conducting layer 30 in deposition zone 240. A material for a second electrode layer 50 is then deposited on the at least one organic EL layer 40 in deposition zone 250. The fiber core 20 with layers 30, 40, and 50 then travels sequentially through zones 262 and 264, in which sublayers 62 and 64 of a barrier layer are formed. For example, sublayer 62 is a polymeric sublayer and sublayer 64 is an inorganic sublayer, or vice versa. An inorganic or metal sublayer layer; e.g., aluminum, may be applied by vacuum metallizing or sputtering. A layer of silicon oxide or aluminum oxide or other oxide material may be deposited by a plasma-assisted or enhanced chemical vapor deposition technique. For example, $SiO_x$ may be deposited by a plasma vapor deposition process using an oxidizing or inert carrier gas. $SiO_x$ may be evaporated from a crucible by an electron beam and deposited over the polymeric sublayer. Preferably this is conducted in an oxygen rich environment for obtaining the proper composition of the $Sio_{ux}$. Aluminum oxide can be deposited by electron beam evaporation or preferably by evaporation of aluminum which is converted to an oxide in an oxygen plasma. Other conventional techniques for depositing silica, alumina or other oxides or nitrides may be used.

The polymeric sublayer may be applied in a coating zone where one or more nozzles sprays a thin layer of monomer onto the flexible fiber surface. In the event the monomer is to be cured by ultraviolet irradiation, a photoinitiator may be included in the sprayed composition. An alternative to spraying the surface with monomer comprises dipping the fiber into a liquid monomer composition. Another alternative for depositing a monomer layer is to flash evaporate the monomer onto the fiber surface in a vacuum chamber. Following the coating station, the fiber passes a curing station where UV light, heat, electron bombardment, or other radiation cures the monomer to form the polymeric sublayer.

Although FIG. 6 shows two deposition zones 262 and 264 for forming two sublayers 62 and 64, additional deposition zones may be provided sequentially after zone 264 to provide facilities for forming additional polymeric and inorganic sublayers. Finally, in deposition zone 270, an encapsulating layer 70 is deposited around the entire fiber core 20 with all the underlying layers already formed thereon.

Moreover, additional zones may be provided at appropriate locations in apparatus 130 to provide facilities for depositing electron or hole injection enhancement layers and/or electron or hole transport layers. In addition to the various deposition zones, additional intervening zones may be desirably provided between two adjacent zones to provide facilities for further preparation or completion of the immediately prior layer. For example, an intervening zone may be provided immediately after zone 240 so that UV, heat, other radiation, or electron bombardment may be provided to cure the organic EL layer 40. Other intervening zones may provide facilities to dry, cure, anneal, or otherwise further treat or prepare an immediately prior layer or sublayer. The completed OLEF of the present invention is taken up by second spool 232 and later cut into desired lengths. Furthermore, it may be desirable to control the atmosphere and/or pressure in each deposition zone. In such a case, equipment such as gas curtains or seals that are well known in the art may be provided between any two zones to minimize the chance of cross contamination between them.

OLEFs of the present invention are useful for incorporation into displays. Various OLEFs, emitting light of one or more colors, are shaped into messages or objects and disposed on a display. Various OLEFs may be activated at different times to produce desired effects, such as showing different messages or creating an effect of moving objects.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A method for making A flexible OLEF, said method comprising the steps of:
   (1) providing an elongated fiber core of a core material that comprises a first electrically conducting material that forms a first electrode;
   (2) depositing at least one layer of at least one organic EL material on said first electrode;
   (3) depositing a layer of a second electrically conducting material on at least a portion of said at least one layer of said at least one organic EL material to form a second electrode; and
   (4) depositing a barrier layer over said second electrode such that said barrier layer surrounds said second electrode and said organic EL material, said barrier layer comprising a plurality of sublayers of a polymeric material and an inorganic material.

2. The method according claim 1, wherein said barrier layer is formed by depositing alternating sublayers of said polymeric material and said inorganic material.

3. The method according claim 1, further comprising the step of depositing an encapsulating layer around said barrier layer.

4. The method according to claim 3, wherein said encapsulating layer comprises a material selected from the group consisting of silicone and epoxy.

5. The method according claim 1, wherein said elongated fiber core has a structure selected from the group consisting of fiber, cable, and wire and comprises a core material selected from the group consisting of glass, polymers, metals, and composites thereof.

6. The method according to claim 5, wherein said core has a largest dimension of a cross section in a range from about 1 micrometer to about 10 mm.

7. The method according to claim 6, wherein said largest dimension is preferably in a range from about 10 micrometers to about 2 mm, more preferably from about 100 micrometers to about 1 mm.

8. The method according to claim 5, wherein said elongated fiber core comprises said structure on which said first electrically conducting material is deposited.

9. The method according to claim 8, wherein said first electrically conducting material is selected from the group consisting of K, Li, Na, Mg, La, Ce, Ca, Sr, Ba, Al, Ag, In, Sn, Zn, Zr, alloys thereof, and mixtures thereof.

10. The method according to claim 8, wherein said first electrically conducting material is formed in a layer having a thickness in a range from about 50 nm to about 500 nm.

11. The method according to claim 10, wherein said thickness is preferably in a range from about 50 nm to about 200 nm.

12. The method according to claim 1 wherein said at least one organic EL material is selected from the group consisting of poly(n-vinylcarbazole), poly(alkylfluorene), poly(paraphenylene), polysilanes, derivatives thereof, mixtures thereof, and copolymers thereof.

13. The method according to claim 1, wherein said at least one organic EL material is selected from the group consisting of 1,3,5-tris[n-(4-diphenylaminophenyl) phenylamino] benzene, phenylanthracene, tetraarylethene, coumarin, rubrene, tetraphenylbutadiene, anthracene, perylene, coronene, aluminum-(picolymethylketone)-bis[2,6-di9t-butyl)phenoxide, scandium-(4-methoxy-picolymethylketone)-bis(acetylacetonate), aluminum-acetylacetonate, gallium-acetylacetonate, indium-acetylacetonate, and tris(8-quinolinolato)-aluminum III.

14. The method according to claim 13, wherein said at least one organic EL material is carried in a substantially transparent polymer.

15. The method according to claim 1, wherein said at least one layer of at least one organic EL material has a thickness from about 100 nm to about 300 nm.

16. The method according to claim 1, wherein said at least one layer of at least one organic EL material further comprises a phosphor material dispersed therein.

17. The method according to claim 16, wherein said phosphor absorbs a portion of EM radiation emitted by said at least one organic EL material in a first wavelength range and emits EM radiation in a second wavelength range.

18. The method according to claim 17, wherein said phosphor is selected from the group consisting of $(Y_{1-x}Ce_x)_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_xCe_y)(Al_{5-z}Ga_z)O_{12}$; $(Gd_{1-x}Ce_x)Sc_2Al_3O_{12}$; $Ca_8Mg(SiO_4)_4Cl_2:Eu^{2+},Mn^{2+}$; $GdBO_3:Ce^{3+}$, $Tb^{3+}$; $CeMgAl_{11}O_{19}$: $Tb^{3+}$; $Y_2SiO_5:Ce^{3+},Tb^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+}$, $Mn^{2+}$; $SrMgP_2O_7:Eu^{2+},Mn^{2+}$; $(Y,Gd)(V,B)O_4:Eu^{3+}$; $3.5MgO.0.5MgF_2.GeO_2:Mn^{4+}$; $BaMg_2Al_{16}O_{27}:Eu^{2+}$; $Sr_5(PO_4)_{10}Cl_2:Eu^{2+}$; and mixtures thereof; wherein $0 \leq x \leq 1$, $0 \leq y \leq 1$, $0 \leq z \leq 5$ and $x+y \leq 1$.

19. The method according to claim 17, wherein said phosphor is selected from the group consisting of perylenes, benzopyrenes, coumarin dyes, polymethine dyes, xanthene dyes, oxobenzanthracene dyes, perylenebis(dicarboximide), pyrans, thiopyrans, and azo dyes.

20. The method according to claim 1, further comprising the step of disposing a wavelength-adjusting layer over said barrier layer, wherein said wavelength-adjusting layer comprises at least one phosphor dispersed in a polymeric material, and said at least one phosphor is selected from the group consisting of inorganic phosphors and organic phosphors.

21. The method according to claim 20, wherein said inorganic phosphors are selected from the group consisting of $(Y_{1-x}Ce_x)_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_xCe_y)(Al_{5-z}Ga_z)O_{12}$; $(Gd_{1-x}Ce_x)Sc_2Al_3O_{12}$; $Ca_8Mg(SiO_4)_4Cl_2:Eu^{2+},Mn^{2+}$; $GdBO_3:Ce^{3+},Tb^{3+}$; $CeMgAl_{11}O_{19}:Tb^{3+}$; $Y_2SiO_5:Ce^{3+},Tb^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+},Mn^{2+}$; $SrMgP_2O_7:Eu^{2+},Mn^{2+}$; $(Y,Gd)(V,B)O_4:Eu^{3+}$; $3.5MgO \cdot 0.5MgF_2 \cdot GeO_2:Mn^{4+}$; and mixtures thereof; wherein $0 \leq x \leq 1$, $0 \leq y \leq 1$, $0 \leq z \leq 5$ and $x+y \leq 1$.

22. The method according to claim 20, wherein said organic phosphors are selected from the group consisting of perylenes, benzopyrenes, coumarin dyes, polymethine dyes, xanthene dyes, oxobenzanthracene dyes, perylenebis (dicarboximide), pyrans, thiopyrans, and azo dyes.

23. The method according to claim 1, wherein the step of depositing at least one layer of at least one organic EL material comprises depositing a plurality of layers of organic EL materials, each layer being in contact with another layer, and each layer comprising a different organic EL material.

24. The method according to claim 1, wherein said second electrically conducting material is selected from the group consisting of ITO, tin oxide, indium oxide, zinc oxide, indium zinc oxide, and mixtures thereof.

25. The method according to claim 24, further comprising the step of disposing a layer of a metal between said second electrically conducting material and said at least one layer of at least one organic EL material, said metal being selected from the group consisting of Pt, Pd, Ag, Au, mixtures thereof, and alloys thereof.

26. The method according to claim 24, wherein said second electrode layer has a thickness in a range from about 50 nm to about 500 nm.

27. The method according to claim 26, wherein said thickness is preferably in a range from about 50 nm to about 200 nm.

28. The method according to claim 1, wherein said step of depositing at least one barrier layer comprises depositing a plurality of alternating sublayers of at least a polymeric material and at least an inorganic material.

29. The method according to claim 1, wherein said step of depositing at least one barrier layer comprises depositing a plurality of alternating sets of adjacent sublayers of polymeric materials and adjacent sublayers of inorganic materials.

30. The method according to claim 28, wherein said polymeric material is selected from the group consisting of polyacrylates, polyepoxides, poly(vinyl fluoride), poly (vinylidene chloride), poly(vinyl alcohol), polyethyleneterephthalate copolymer of vinyl alcohol and glyoxal, parylenes, polymers derived from cycloolefins and their derivatives, and mixtures thereof.

31. The method according to claim 28, wherein said inorganic material is selected from the group consisting of metals, metal oxides, and metal nitrides.

32. The method according to claim 31, wherein said metals are selected from the group consisting of aluminum, silver, copper, gold, platinum, palladium, and alloys thereof.

33. The method according to claim 31, wherein said metal oxides are selected from the group consisting of ITO, tin oxide, silicon oxides, cadmium oxide, indium oxide, zinc oxide, aluminum oxide, magnesium oxide, composites thereof, and solutions thereof.

34. The method according to claim 31, wherein said metal nitrides are selected from the group consisting of nitrides of Groups IVA, VA, VIA, IIIB, and IVB of the Periodic Table.

35. The method according to claim 34, wherein said metal nitrides are selected from the group consisting of silicon nitride and silicon oxynitride.

36. A continuous process for making a flexible OLEF, said process comprising the steps of:
   (1) winding from a first spool to a second spool a flexible fiber core comprising a first electrically conducting material that forms a first electrode;
   (2) depositing at least one layer of at least one organic EL material over said first electrode while said fiber core travels from said first spool to said second spool, thereby forming a fiber of a first stage;
   (3) depositing a second electrically conducting material on at least a portion of a surface of said at least one layer of said at least one organic EL material while said fiber core travels from said first spool to said second spool, thereby forming a fiber of a second stage; and
   (4) depositing a barrier layer comprising a plurality of sublayers of at least one polymeric material and at least one inorganic material over an entire surface of said fiber of the second stage.

37. The process according to claim 36, wherein said step of depositing said barrier layer comprises depositing alternating sublayers of said polymeric material and said inorganic material.

38. The process according to claim 36, wherein said step of depositing said barrier layer comprises depositing alternating sets of adjacent sublayers of polymeric materials and adjacent sublayers of inorganic materials.

39. An apparatus for a continuous fabrication of a flexible OLEF, said apparatus comprising:
   (1) means for winding a flexible fiber core member from a first spool to a second spool, said fiber core comprising a first electrically conducting material;
   (2) first means for depositing at least one layer of at least one organic EL material over said fiber core member to form a fiber of a first stage while said fiber core member travels from said first spool to said second spool;
   (3) second means for depositing a second electrically conducting material on at least a portion of said at least one layer of said at least one organic EL material to form a fiber of a second stage while said fiber of the first stage travels from said first spool to said second spool; and
   (4) third means for depositing a barrier layer comprising a plurality of sublayers of a polymeric material and an inorganic material over said fiber of the second stage while said fiber of the second stage travels from said first spool to said second spool.

40. The apparatus according to claim 39, wherein said barrier layer comprises alternating sublayers of said polymeric material and said inorganic material.

41. The apparatus according to claim 39, wherein said barrier layer comprises alternating sets of adjacent sublayers of polymeric materials and adjacent sublayers of inorganic materials.

42. The apparatus according to claim 39, wherein said first, second, and third means for depositing comprise deposition zones and associated equipment for supplying materials for deposition on said fiber.

* * * * *